(12) United States Patent
Lin et al.

(10) Patent No.: US 7,696,629 B2
(45) Date of Patent: *Apr. 13, 2010

(54) CHIP-STACKED PACKAGE STRUCTURE

(75) Inventors: Chun-Ying Lin, Tainan (TW); Yu-Tang Pan, Tainan (TW); Shih-Wen Chou, Tainan (TW); Geng-Shin Shen, Tainan (TW)

(73) Assignee: Chipmos Technology Inc., Hsinchu (TW)

( * ) Notice: Subject to any disclaimer, the term of this patent is extended or adjusted under 35 U.S.C. 154(b) by 147 days.

This patent is subject to a terminal disclaimer.

(21) Appl. No.: 11/872,205

(22) Filed: Oct. 15, 2007

(65) Prior Publication Data

US 2008/0265397 A1 Oct. 30, 2008

(30) Foreign Application Priority Data

Apr. 30, 2007 (TW) .............................. 96115393 A
May 15, 2007 (TW) .............................. 96117272 A (51) Int. Cl.
H01L 23/48 (2006.01)
H01L 23/52 (2006.01)
H01L 29/40 (2006.01)

(52) U.S. Cl. .............................. 257/777; 257/E23.085
(58) Field of Classification Search ................. 257/777, 257/706, 778, E23.085

See application file for complete search history.

(56) References Cited

U.S. PATENT DOCUMENTS

| 6,922,339 B2 * | 7/2005 | Nakamura et al. ........... 361/719 |
| 7,605,477 B2 * | 10/2009 | Wong et al. .................. 257/777 |
| 2004/0124539 A1 * | 7/2004 | Yang et al. ................... 257/777 |
| 2006/0201704 A1 * | 9/2006 | Heng et al. .................. 174/260 |
| 2008/0265400 A1 * | 10/2008 | Pan et al. ..................... 257/698 |

* cited by examiner

*Primary Examiner*—David A Zarneke
*Assistant Examiner*—Jenny L Wagner
(74) *Attorney, Agent, or Firm*—Thomas, Kayden, Horstemeyer & Risley (57) ABSTRACT

A chip stacked package structure and applications are provided, wherein the chip stacked package structure comprises a substrate, a first chip, a patterned circuit layer and a second chip. The substrate has a first surface and an opposite second surface. The first chip with a first active area and an opposite first rear surface is electrically connected to first surface of substrate by a flip chip bonding process. The patterned circuit layer set on the dielectric layer is electrically connected to the substrate via a bonding wire. The second chip set on the patterned circuit layer has a second active area and a plurality of second pads formed on the second active area, wherein the second bonding pad is electrically connected to the patterned circuit layer.

13 Claims, 11 Drawing Sheets

CHIP-STACKED PACKAGE STRUCTURE

RELATED APPLICATIONS

The present application is based on, and claims priorities from, Taiwan Application Serial Number 96115393, filed Apr. 30, 2007, and Taiwan Application Serial Number 96117272, filed May 15, 2007, the disclosures of which are hereby incorporated by reference herein in their entirety.

FIELD OF THE INVENTION

The present invention relates to a semiconductor package structure and the applications thereof, and more particularly relates to a chip-stacked package structure and the applications thereof.

BACKGROUND OF THE INVENTION

Nowadays, electronic devices are developed to provide increased functionality. Single chips with multiple integrated functions are therefore required to have extended functionality and be able to fit into small electronic devices. To integrate more functions in a single package, the package structure of the chip has evolved from a two-dimensions to three-dimensions and from a single-die package structure to a multiple-die package structure.

A chip-stacked package structure is a semiconductor package structure with several chips of various functions integrated in a single package structure, wherein these chips are stacked on a substrate with surface mount technology (SMT), so as to reduce the processing steps for forming a semi conductor package and to decrease the size of the electronic device. Whereby the chip-stacked package structure has the advantages of small size, high operating frequency, high speed and low costs.

Figure 1:
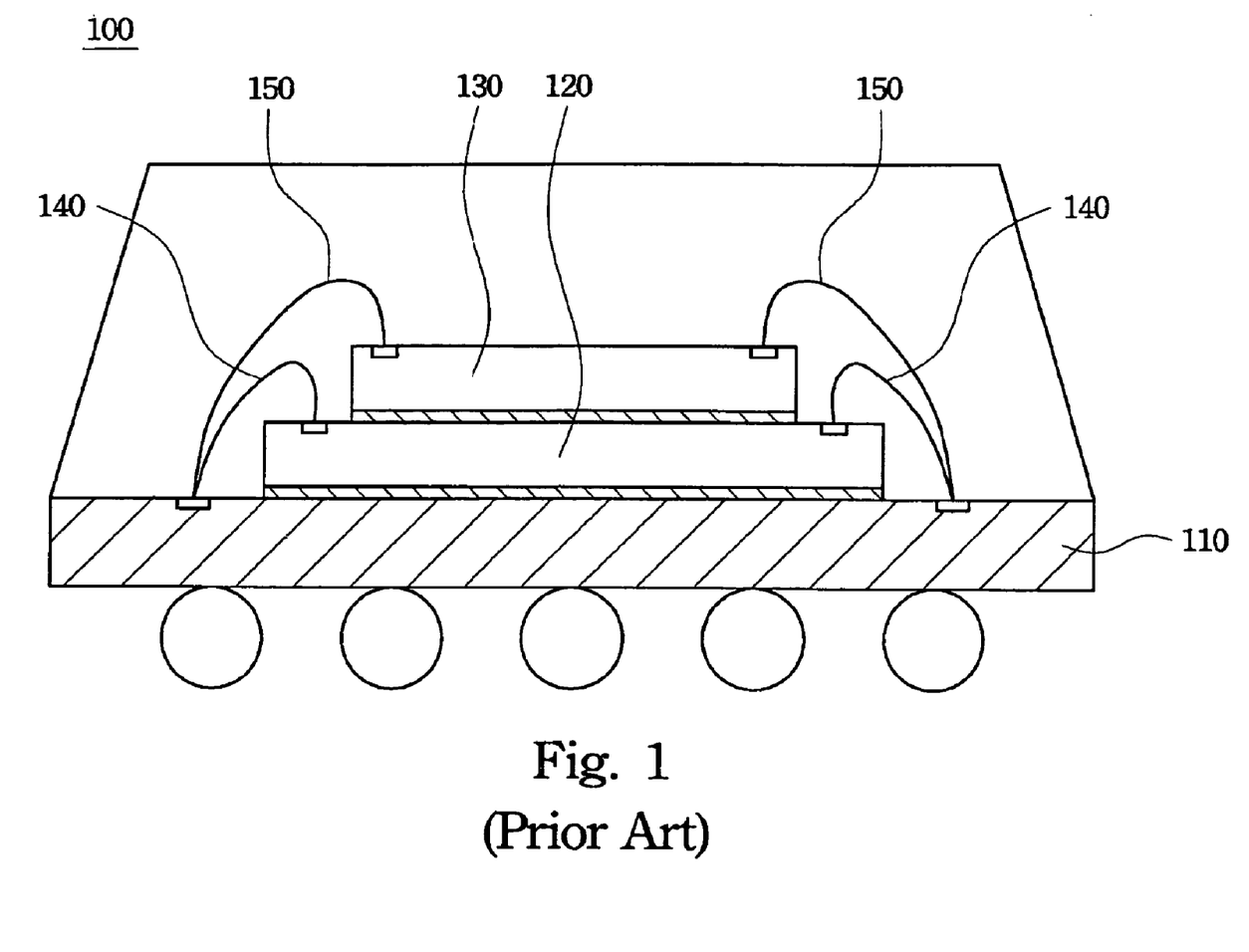
FIG. 1 illustrates a cross sectional view of a conventional chip stacked package structure 100.

FIG. 1 illustrates a cross sectional view of a conventional chip stacked package structure 100. The chip-stacked package structure 100 comprises a substrate 110, a first chip 120, a second chip 130 and a plurality of bonding wires, such as bonding wires 140 and 150. The bonding wire 140 electrically connects the first chip 120 set on the substrate 110 to the substrate 110, and the bonding wire 150 electrically connects the second chip 130 stacked on the first chip 120 to the substrate 110.

To accommodate the arrangement of the bonding wire (the bonding wire 140) connected to the lower chip (the first chip 120); the size of the upper chip (the second chip 130 stacked on the first chip 120) must be smaller than that of the lower chip in a conventional design. Thus the design flexibility and the number of chips stacked in one single package are limited. Furthermore, it is necessary to extend the bonding wires in connecting the chips of small size with the substrate, whereby the radian of the bonding wires may be increased. Consequently, when a subsequent stamping process is conducted, the bonding wires may be wrenched off so as to make the electrical connection short and to decrease its manufacture yield.

Figure 2:
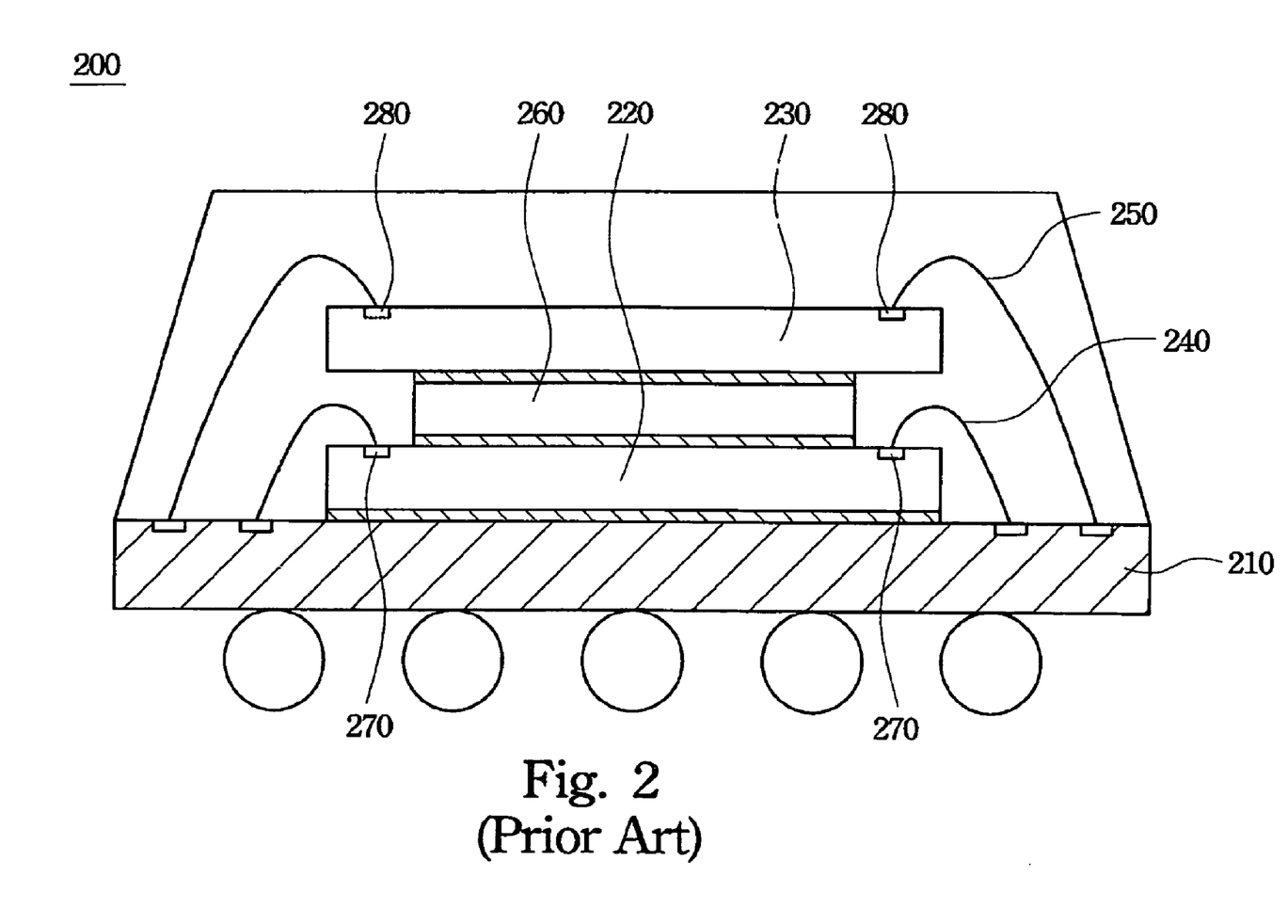
FIG. 2 illustrates a cross view cross-section view of an alternative conventional chip stacked structure 200.

To resolve the aforementioned problems, an alternative conventional chip-stacked package structure is provided. FIG. 2 illustrates a cross view cross-section view of an alternative conventional chip stacked structure 200. The chip-stacked package structure 200 comprises a substrate 210, a first chip 220, a second chip 230, a plurality of bonding wires, such as bonding wires 240 and 250, and a dummy chip 260 set between the first chip 520 and the second chip 230. The first chip 220 set on the substrate 210 has a bonding pad 270 electrically connected to the substrate 210 by the bonding wire 240, and the dummy chip 260 is stacked on the first chip 220. The second chip 230 is stacked on the dummy chip 260. The bonding wire 250 electrically connects the dummy chip 260 has a bonding pad 280 to the substrate 210. Since the size of the dummy chip is smaller than the size of the first chip 220 and the second chip 230, enough wiring space is provided between the lower chip (the first chip 220) and the upper chip (the second chip 230) for the bonding wire 540 electrically bonded on the lower chip. Accordingly, in this case the size of the upper chip (the second chip 230) is not limited anymore.

However, using the dummy can increase the thickness of the pancake structure and may conflict with the trend of package size minimization. Therefore, it is desirable to provide an advanced chip-stacked package structure designed to improving the processing yield so as to decrease the manufacture cost.

SUMMARY OF THE INVENTION

One aspect of the present invention is to provide a chip-stacked package structure. The chip-stacked package structure comprises a substrate, a first chip, a patterned circuit layer, a second chip and a molding compound. The substrate has a first surface and second surface opposite to the first surface. The first chip with a first active area and a first rear surface opposite to the first active area is set on the first surface of the substrate, wherein a flip chip bonding process electrically connects the first active area facing the first surface of the substrate to the substrate. A bonding wire electrically connects a patterned circuit layer set on the first rear surface of the first chip to the substrate. The second chip set on the patterned circuit layer has a second active area and at least one second bonding pad set on the second active area. In addition, the second bonding pad is electrically connected to the patterned circuit layer that is electrically connected to the substrate via the bonding wire. Accordingly the second bonding pad is electrically connected to the substrate. A molding compound encapsulates the substrate, the first chip, the patterned circuit layer and the second chip. The chip-stacked package structure further comprises a plurality of external connecting bumps set on the second surface of the substrate used to connect the substrate with at least one external electronic device, wherein the external connecting bumps may be made of solder.

A second aspect of the present invention is to provide a method for manufacturing a chip-stacked package structure. The method comprises steps as follows: first a substrate with a first surface and a second surface opposite to the first surface is provided. A first chip with a first active area and a first rear surface opposite to the first active area is then set on the substrate, and the first active area facing the first surface of the substrate is electrically connected to the substrate by a flip chip bonding process. Subsequently, a patterned circuit layer is formed on the first rear surface of the first chip, wherein the patterned circuit layer comprises at least one finger connected with at least one bonding pad set on the second chip that will subsequently be stacked on the patterned circuit layer. And a bonding wire is then formed to electrically connect the substrate with the patterned circuit layer. Subsequently, the second chip is stacked on the patterned circuit layer and the second bonding pad is electrically connected to the finger of the patterned circuit layer and then to the substrate via the bonding wire that electrically connects the patterned circuit layer with the substrate. A molding compound then encapsulates the substrate, the first chip, the patterned circuit layer and the second chip. A plurality of external connecting bumps, such as a plurality of solder bumps, are then formed on the second surface of the substrate used to connect the substrate with at least one external electronic device.

A third aspect of the present invention is to provide a chip-stacked package structure. The chip-stacked package structure comprises a substrate, a first chip, a patterned circuit layer, a second chip and an electrical connecting means for electrically connecting the second patterned circuit layer and the substrate. The substrate has a first surface and second surface opposite to the first surface. The first chip with a first active area and a first rear surface opposite to the first active area is set on the first surface of the substrate, and is electrically connected to the substrate. The second chip set on the first chip has a second active area and at least one second bonding pad set on the second active area. The patterned circuit layer set on the second active area of the second chip is electrically connected with the second bonding pad and is electrically connected to the substrate via the electrical connecting means.

A fourth aspect of the present invention is to provide a chip-stacked package structure. The chip-stacked package structure comprises a substrate, a first chip, a patterned circuit layer, a second chip and a bonding wire. The substrate has a first surface and second surface opposite to the first surface. The first chip with a first active area and a first rear surface opposite to the first active area is set on the substrate, wherein the first rear surface faces the first surface of the substrate. The second chip set on the first chip has a second active area facing the first active area and at least one second bonding pad set on the second active area. The patterned circuit layer set on the first active area of the first chip is electrically connected with the second bonding pad and is electrically connected to the substrate via the bonding wire.

In accordance with above descriptions, the features of the present invention provide at least one patterned circuit layer set either on a lower chip or on an upper chip in a chip-stacked package structure, wherein the patterned circuit layer has at least one finger electrically connected with at least one bonding pad set on the upper chip, whereby the wiring arrangements of the upper chip constituted by the bonding pad can be redistributed by the finger of the patterned circuit layer to shift the bonding area of the bonding pad towards the edge of the upper chip for a bonding wire to electrically connect the bonding pad with the substrate. Accordingly, it is not necessary to extend the length and the radian of the bonding wire when connecting the upper chips with the substrate or to reduce the size of the upper chip to include more chips in a single package, so as to solve the prior problems in the art. Also, since the lengths of wires are reduced, the disadvantage of wire sweep also can be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The foregoing aspects and many of the attendant advantages of this invention will become more readily appreciated as the same becomes better understood by reference to the following preferred embodiments of chip-stacked package structures.

Figure 3:
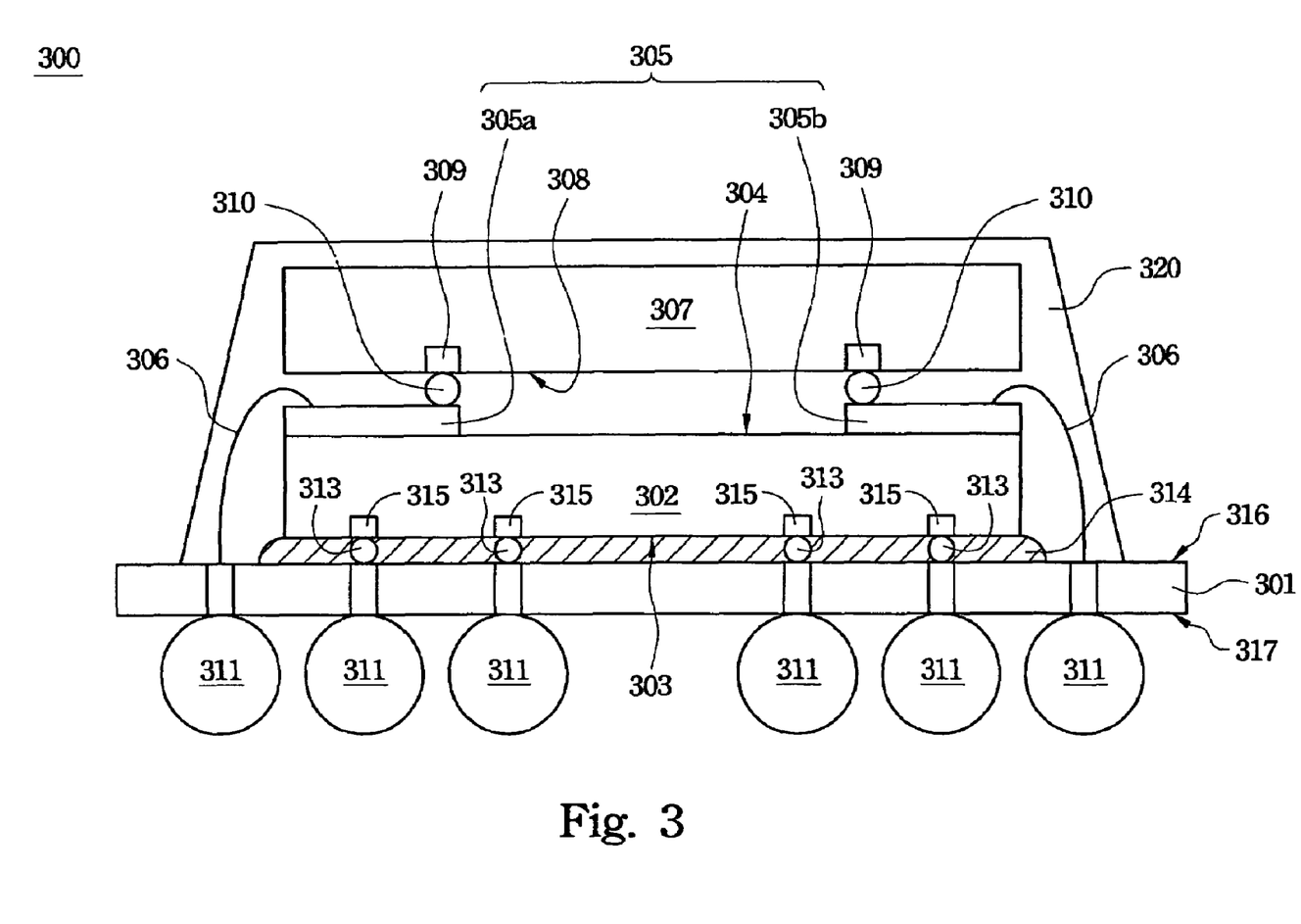
FIG. 3 illustrates a cross section view of a chip-stacked package structure 300 in accordance with a first preferred embodiment of the present invention.

FIG. 3 illustrates a cross section view of a chip-stacked package structure 300 in accordance with a first preferred embodiment of the present invention.

The chip-stacked package structure 300 comprises a substrate 301, a first chip 302, a patterned circuit layer 305, a second chip 307 and a molding compound 320.

The chip-stacked package structure 300 is formed by the following steps: First, the substrate 301 with a first surface 316 and a second surface 317 opposite to the first surface 316 is provided. In some preferred embodiments of the present invention, the substrate 301 is a lead frame, a printed circuit board or a die carrier. In the present embodiment, the substrate 301 is a printed circuit board made of FR4 or BT epoxy, or made of the materials that constitute a flexible printed circuit board.

A flip chip bonding process mounts the first chip 302, with a first active area 303 facing the first surface 316 of the substrate 301 and a first rear surface 304 opposite to the first active area 303, on the first surface 316 thereby electrically connecting the first active area 303 to the first surface 316 of the substrate 301. In the present embodiment, a plurality of bumps 313 electrically connect the first bonding pads 315 on the first active area 303 to the substrate 301. After the first chip 302 is flipped and stacked on the first surface 316 of the substrate 301, an underfill material 314 encapsulates the bumps 313 and fixes the first chip 302 over the first surface 316 of the substrate 301.

Subsequently, the patterned circuit layer 305 is formed on the first rear surface 304 of the first chip 302, and a bonding wire 306 electrically connects the patterned circuit layer 305 to the substrate 301. In the embodiments of the present invention, the patterned circuit layer 305 with a plurality of fingers, such as fingers 305a and 305b, is a redistribution layer. One end of each finger (for example finger 305a) is electrically connected with one of the second bonding pads 309 set the second chip 307 that is subsequently stacked on the patterned circuit layer 305, and the other end of the finger extends towards another area of the first rear surface 304 apart from the second bonding pads 309. For example, the other end of the finger 305a extends towards the edge of the first rear surface 304.

Then, a flip chip bonding process stacks the second chip 307 on the patterned circuit layer 305, wherein the second chip 307 has a second active area 308 with a plurality of second bonding pads 309 set thereon. Each of the bonding pads 309 is electrically connected to one of the fingers (305a or 305b) of the pattered circuit layer 305 via a solder bump or a conductive bump 310. In the embodiments of the present invention, the pattern contributed by the fingers (305a or 305b) of the pattered circuit layer 305 can altered in accordance with the various arrangements of the bonding pads 309 set on different types of the second chip 307.

Since at least one of the bonding pads 309 set on the second chip 307 is connected with one of the fingers (for example finger 305a and finger 305c) that constitute the patterned circuit layer 305, the patterned circuit layer 305 can redistribute the bonding area of the bonding pads 309 that are originally concentrated at the center of the second active area 308, so as to disperse the bonding area of the bonding pads 309 to another location of the active area 308. For example the bonding area of the bonding pads 309 can be shifted to the edge of the second chip 307, and then the conductive bump 310 can electrically connect the edge of the second chip 307 to the substrate 301 by the bonding wire 306. Accordingly the second chip 307 that has a size identical to that of the first chip 302 can be stacked on the first chip 302 without extending the length and the radian of the bonding wire 306 in connecting the second chip 307 with the substrate 301 or utilizing a dummy chip to include more chips in a single package. For another embodiment of the present invention not drawing in the specification, the first chip 302 and the second chip 307 have different sizes. Also, since the lengths of wires are reduced, the disadvantage of wire sweep also can be improved.

After that, a molding compound 320 encapsulates the substrate 301, the first chip 302, the patterned circuit layer 305 and the second chip 307. A plurality of external connecting bumps 311, such as a plurality of solder bumps, are then formed on the second surface 317 of the substrate 301 that connects the substrate 301 with at least one external electronic device (not shown).

Figure 4:
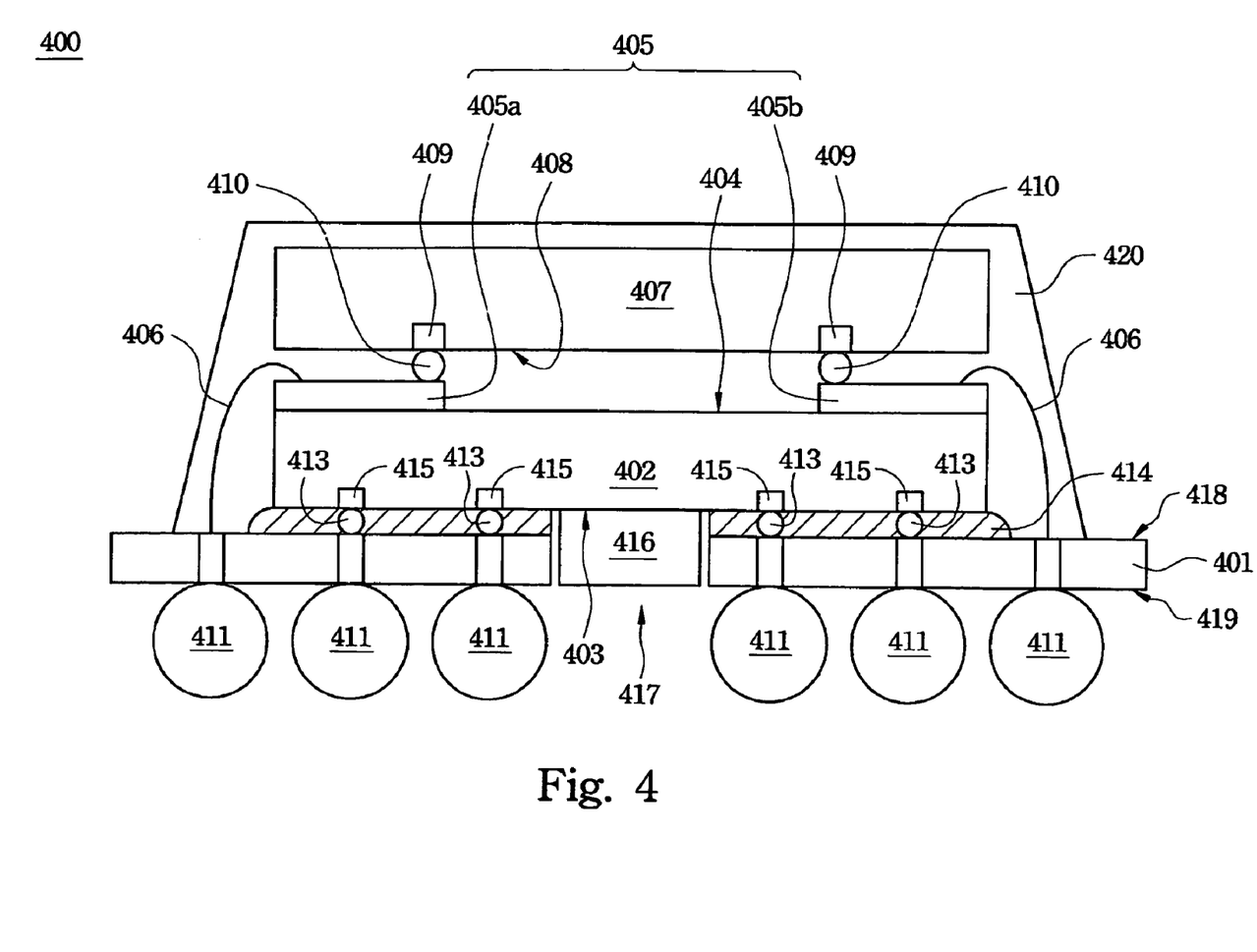
FIG. 4 illustrates a cross section view of a chip-stacked package structure 400 in accordance with a second preferred embodiment of the present invention.

FIG. 4 illustrates a cross section view of a chip-stacked package structure 400 in accordance with a second preferred embodiment of the present invention.

The chip-stacked package structure 400 comprises a substrate 401, a first chip 402, a patterned circuit layer 405, a second chip 407 and a molding compound 420.

The chip-stacked package structure 400 is formed by the following steps: First, the substrate 401 with a first surface 418 and a second surface 419 opposite to the first surface 418 is provided.

Next a through hole 417 is formed to penetrate through the substrate 401, and the first chip 402 with a first active area 403 facing the first surface 418 of the substrate 401 and a first rear surface 404 opposite to the first active area 403 is then mounted on the first surface 418, so as to electrically connect the first active area 403 to the first surface 418 of the substrate 401. In the present embodiment, the first active area 403 has a plurality of first bonding pads 415 electrically connected to the substrate 401 via a plurality of bumps 413. After the first chip 402 is stacked on the first surface 418 of the substrate 401, an underfill material 414 is used to encapsulate the bumps 413 and to fix the first chip 402 over the first surface 418 of the substrate 401.

Since a portion of the first active area 403 can be exposed from the through hole 417 penetrates through the substrate 401. In some preferred embodiment, a heat sink 416 can be extend out of the through hole 417 from the exposed portion of the first active area 403 to enhance the heat dispersion of the chip-stacked package structure 400.

Subsequently, the patterned circuit layer 405 is formed on the first rear surface 404 of the first chip 402, and a bonding wire 406 electrically connects the patterned circuit layer 405 to the substrate 401. In the embodiments of the present invention, the patterned circuit layer 405 with a plurality of fingers, such as fingers 405a and 405b, is a redistribution layer. One end of each finger (for example the finger 405a) is electrically connected with one of a second bonding pads 409 set the second chip 407 that is subsequently stacked on the patterned circuit layer 405, and the other end of the finger 405a extends towards another area of the first rear surface 404 apart from the second bonding pad 409. For example, the other end of the finger 405a extends towards the edge of the first rear surface 404.

Then, a flip chip bonding process stacks the second chip 407 on the patterned circuit layer 405, wherein the second chip 407 has a second active area 408 with a plurality of second bonding pads 409 set thereon. Each of the bonding pads 409 is electrically connected to one of the fingers (405a or 405b) of the pattered circuit layer 405 via a solder bump or a conductive bump 410. In the embodiments of the present invention, the pattern contributed by the fingers (405a or 405b) of the pattered circuit layer 405 can be altered in accordance with variations in the bonding pad 409 arrangements set on different types of the second chips 407.

After that, a molding compound 420 encapsulates the substrate 401, the first chip 402, the circuit board 423 and the second chip 407. A plurality of external connecting bumps 411, such as a plurality of solder bumps, are then formed on the second surface 419 of the substrate 401 used to connect the substrate 401 with at least one external electronic device (not shown).

Since at least one of the bonding pads 409 set on the second chip 407 is associated with one of the fingers (For example finger 405a and finger 405c) that constitute the patterned circuit layer 405, thus the patterned circuit layer 405 can redistribute the bonding area of the bonding pads 409 that are originally concentrated at the center of the second active area 408, so as to disperse the bonding area of the bonding pads 409 to other locations of the active area 408. For example the bonding area of the bonding pads 409 can be shifted to the edge of the second chip 407, and then be electrically connected to the substrate 401 via the conductive bump 410, the patterned circuit layer 405 and the bonding wire 406. Accordingly the second chip 407 that has a size identical to that of the first chip 402 can be stacked on the first chip 402 without extending the length and the radian of the bonding wire 406 in connecting the second chip 407 with the substrate 401 or utilizing a dummy chip for involving more chips in a single package.

Figure 5:
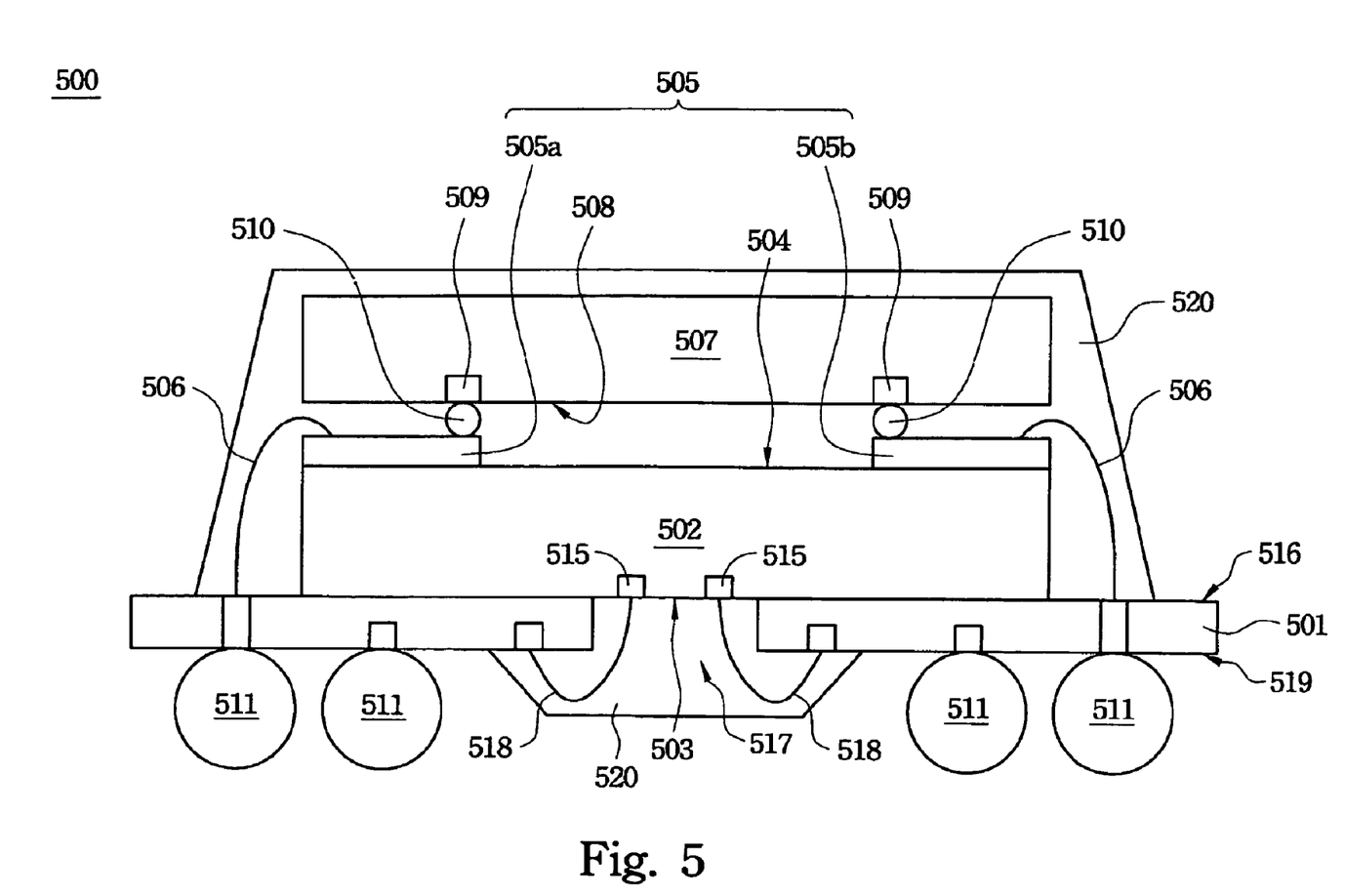
FIG. 5 illustrates a cross section view of a chip-stacked package structure 500 in accordance with a third preferred embodiment of the present invention.

FIG. 5 illustrates a cross section view of a chip-stacked package structure 500 in accordance with a third preferred embodiment of the present invention.

The chip-stacked package structure 500 comprises a substrate 301, a first chip 502, a patterned circuit layer 505, a second chip 507 and a molding compound 520.

The chip-stacked package structure 500 is formed by the following steps: First, the substrate 501 with a first surface 516 and a second surface 519 opposite to the first surface 516 is provided.

Next a through hole 517 is formed to penetrate the substrate 501, and the first chip 502 with a first active area 303 facing the first surface 516 of the substrate 501 and a first rear surface 504 opposite to the first active area 503 is then mounted on the first surface 516, so as to electrically connect the first active area 503 to the substrate 501.

In the present embodiment, a portion of the first active area 503 mounted on the first surface 516 of the substrate 501 is exposed by the through hole 517 penetrating through the substrate 501, and the first chip 502 has a plurality of first bonding pads 515 set on the exposure portion of the first active area 503 electrically connected to the substrate 501 via a plurality of bonding wires 518 passing through the through hole 517.

Subsequently, the patterned circuit layer 505 is formed on the first rear surface 504 of the first chip 502, and is electrically connected to the substrate 501 by a bonding wire 506. In the embodiments of the present invention, the patterned circuit layer 505 with a plurality of fingers, such as fingers 505a and 505b, is a redistribution layer. One end of each finger (for example the finger 505a) is electrically connected with one of a second bonding pads 509 set the second chip 507 that will be subsequently stacked on the patterned circuit layer 505, and the other end of the finger 505a extends towards another area of the first rear surface 504 apart from the second bonding pad 509. For example, the other end of the finger 505a extends towards the edge of the first rear surface 504.

Then, the second chip 507 is stacked on the patterned circuit layer 505 by a flip chip bonding process, wherein the second chip 507 has a second active area 508 with a plurality of second bonding pads 509 set thereon. Each of the bonding pads 509 is electrically connected to one of the fingers (505a or 505b) of the pattered circuit layer 505. In the embodiments of the present invention, the pattern contributed by the fingers (505a or 505b) of the pattered circuit layer 505 can be altered in accordance with the various arrangements of the bonding pads 509 set on different types of the second chip 507.

After that, a molding compound 520 encapsulates the substrate 501, the first chip 502, the circuit board 523 and the second chip 507. A plurality of external connecting bumps 511, such as a plurality of solder bumps, are then formed on the second surface 519 of the substrate 501 used to connect the substrate 501 with at least one external electronic device (not shown).

Figure 6:
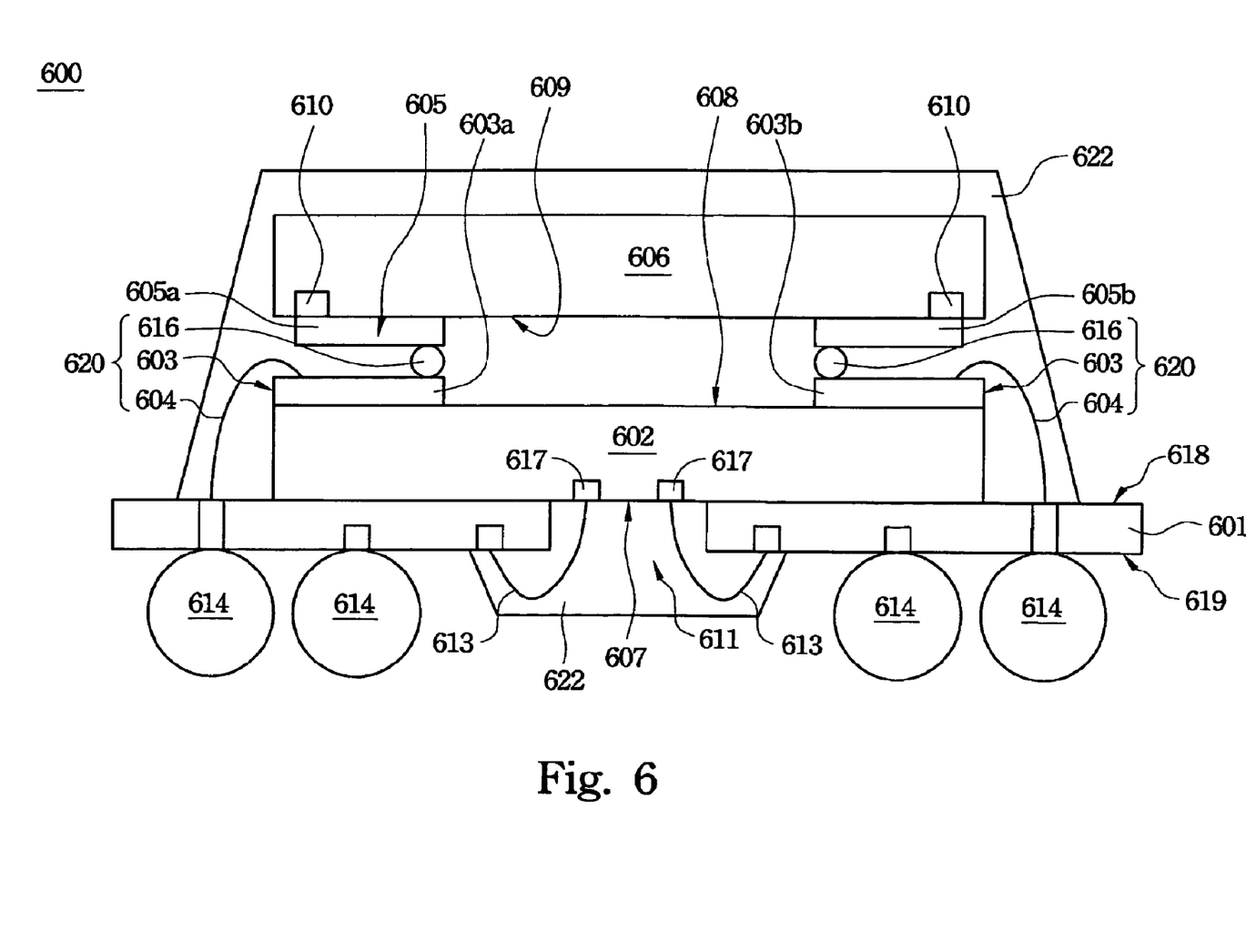
FIG. 6 illustrates a cross section view of a chip-stacked package structure 600 in accordance with a fourth preferred embodiment of the present invention.

FIG. 6 illustrates a cross section view of a chip-stacked package structure 600 in accordance with a fourth preferred embodiment of the present invention.

The chip-stacked package structure 600 comprises a substrate 601, a first chip 602, a second patterned circuit layer 605, a second chip 606, an electrical connecting means 620, a molding compound 622 and a plurality of external connecting bumps 614.

The substrate 601 has a first surface 618 and second surface 619 opposite to the first surface 618. In some preferred embodiments of the present invention, the substrate 601 can be a lead frame, a printed circuit board or a die carrier. The first chip 602 has a first active area 607 facing the substrate 601 and a first rear surface 608 opposite to the first active area 607, wherein an adhering layer (not shown) sets the first chip 602 on the first surface 618 of the substrate 601. In the present embodiment, a portion of the first active area 607 is adhered on the first surface 618 of the substrate 601; and the other portion of the first active area 607 that has a plurality of first bonding pads 617 set thereon is exposed from the though hole 611. Wherein a bonding wire 613 passing though the though hole 611 electrically connects at least one of the first bonding pads 617 to the substrate 601.

The electrical connecting means 620 is set on the first rear surface 608 of the first chip 602. In the present embodiment of the present invention, the electrical connecting means 620 comprises a first patterned circuit layer 603, at least one bonding wire (such as the bonding wire 604), and at least one conductive bump (such as the conductive 616).

The first patterned circuit layer 603 set on the first rear surface 608 is a redistribution layer comprising a plurality of fingers, wherein at least one finger, such as a finger 603a (or a finger 603b), has one end extending towards the edge of the first rear surface 608 of the first chip 602, and the bonding wire 604 electrically connects the finger 603a (or finger 60sb) to the substrate 601; the other end of the finger 603a is electrically connected to the conductive bump 616.

The second chip 606 set on the first chip 602 has a second active area 609 facing the first chip 602, wherein the second active area 609 has at least one second bonding pad, such as bonding pads 610 set thereon. The second patterned circuit layer 605 set on the second active area 609 has a plurality of fingers, such as a finger 605a or a finger 605b, electrically connected with the second bonding pads 610, wherein at least one finger (for example the finger 605a) has an end electrically connected to one of the second bonding pads 610.

When a flip chip bonding process stacks the second chip 606 is stacked on the first chip 602, the second patterned circuit layer 605, the conductive bump 616, the first patterned circuit layer 603 and the bonding wire 604 electrically connects at least one of the second bonding pads 610 to the substrate 601.

The molding compound 622 encapsulates the substrate 601, the first chip 602 and the second chip 606. A plurality of external connecting bumps 614, such as a plurality of solder bumps, are formed on the second surface 619 of the substrate 601 used to connect the substrate 601 with at least one external electronic device (not shown).

In some embodiments of the present invention, the wiring arrangement of the second patterned circuit layer 605 can be altered in accordance with different wiring design of various chips. In addition, the patterned circuit layer 605 is connected with various arrangements of the electrical connecting means that comprises the first patterned circuit layer 603, the bonding wire 604 and the conductive bump 616 can further improve the design flexibility of the chip-stacked structure 600.

When the second chip 606 has a size identical with that of the first chip 602 which the second chip 606 is stacked on, the bonding area of the second bonding pads 610 can be redistributed to another location by the second patterned circuit layer 605. For example the bonding area of the second bonding pad 610 is shifted to the edge of the second chip 606 so as to allow the electrical connecting means 620 to electrically connect the second bonding pads 610 with the substrate 601 without extending the length and the radian of the bonding wires involved in the electrical connecting means 620 or utilizing a dummy chip that involves more chips in a single package. For another embodiment of the present invention not drawing in the specification, the first chip 602 and the second chip 606 have different sizes.

Accordingly, the first chip 601 and the second chip 606 can be stacked on different substrates with various wiring design by virtue of the redistribution in utilizing the second patterned circuit layer 605 and the electrical connecting means 620.

Figure 7:
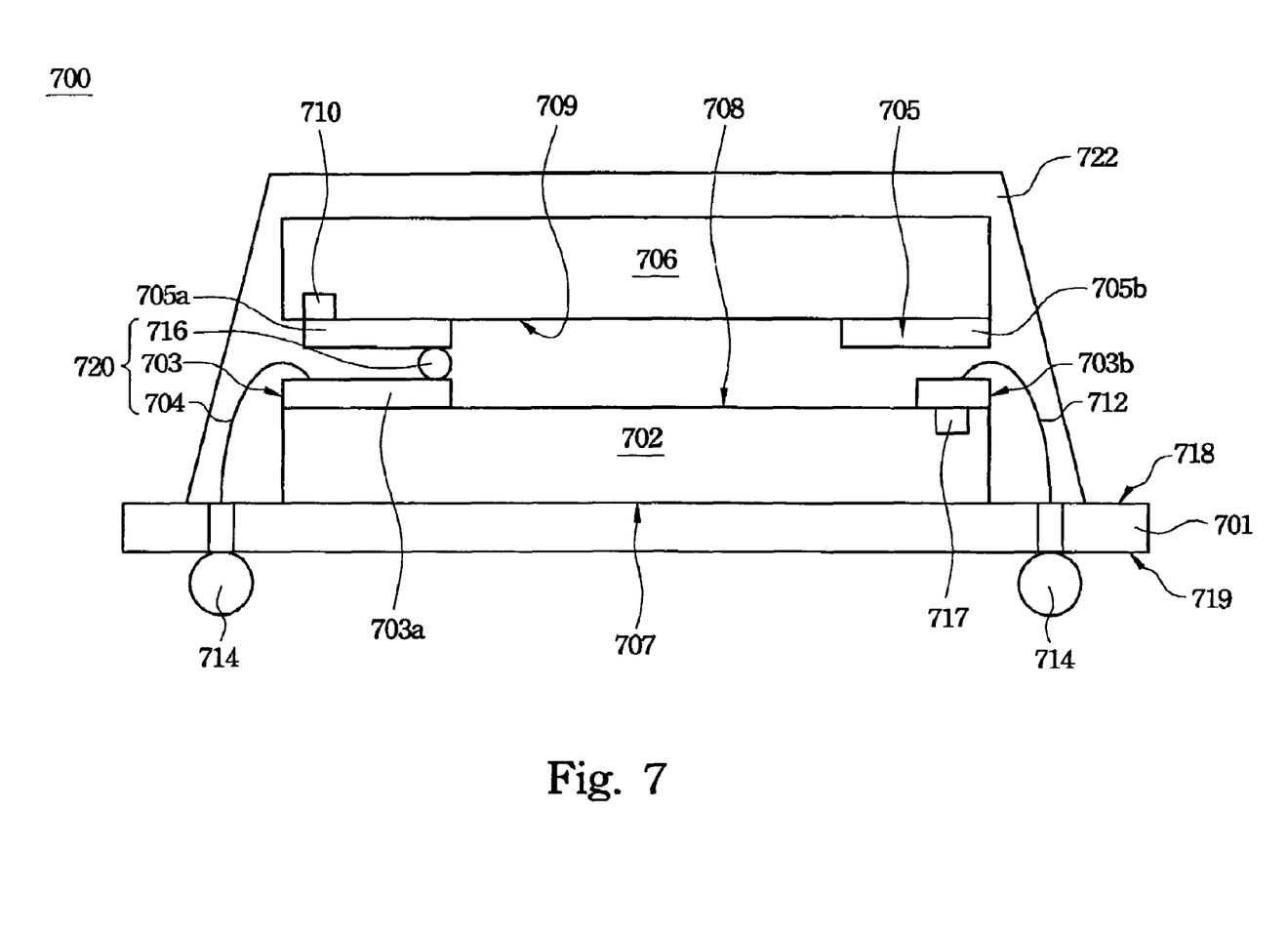
FIG. 7 illustrates a cross section view of a chip-stacked package structure 700 in accordance with a fifth preferred embodiment of the present invention.

FIG. 7 illustrates a cross section view of a chip-stacked package structure 700 in accordance with a fifth preferred embodiment of the present invention.

The chip-stacked package structure 700 comprises a substrate 701, a first chip 702, a second patterned circuit layer 705, a second chip 706, an electrical connecting means 720, a molding compound 722 and a plurality of external connecting bumps 714.

The substrate 701 has a first surface 718 and second surface 719 opposite to the first surface 718. In some preferred embodiments of the present invention, the substrate 701 can be a lead frame, a printed circuit board or a die carrier. The first chip 702 has a first rear surface 707 facing the substrate 701 and a first active area 708 opposite to the first rear surface 707, wherein an adhering layer (not shown) sets the first chip 702 on the first surface 718 of the substrate 701. In the present embodiment, the first active area 708 has a plurality of first bonding pads 717 that are electrically connected to the substrate 701 by a bonding wire 712.

The electrical connecting means 720 set on the first active area 708 of the first chip 702. In the present embodiment of the present invention, the electrical connecting means 720 comprises a first patterned circuit layer 703, at least one bonding wire (such as the first bonding wire 704), and at least one conductive bump (such as the conductive bump 716).

The patterned circuit layer 703 set on the first active area 708 is a redistribution layer comprising a plurality of fingers, such as a first finger 703a and a second finger 703b, wherein at least one finger (the first finger 703a) has one end extending towards the edge of the first active area 708 of the first chip 702, and the first bonding wire 704 electrically connects finger (the first finger 703a) to the substrate 701; the other end of the first finger 703a is electrically connected to the conductive bump 716. One end of the second finger 703b is electrically connected to the first bonding pad 717 set on the first active area 708; the other end of the second finger 703b extends towards the edge of the first active area 708 of the first chip 702, and is electrically connected to the substrate 701 via a second bonding wire 712.

The second chip 706 set on the first chip 702 has a second active area 709 facing the first chip 702, wherein the second active area 709 has at least one second bonding pad 710 set thereon. The second patterned circuit layer 705 set on the second active area 709 has a plurality of fingers, such as a third finger 705a and a fourth dummy finger 705b, electrically connected with the second bonding pad 710. Wherein, at least one finger, such as the third finger 705a, has an end electrically connected to one of the second bonding pad 710; the other end of the third finger 705a is electrically connected to one of the conductive bumps 716. Therefore, when a flip bonding process stacks the second chip 706 on the first chip 702, the finger 725a of the second patterned circuit layer 705, the conductive bump 716, the first finger 703a of the first patterned circuit layer 703 and the bonding wire 704 can electrically connect at least one of the second bonding pads 710 to the substrate 701.

The molding compound 722 encapsulates the substrate 701, the second chip 706 and the first chip 702. A plurality of external connecting bumps 714, such as a plurality of solder bumps, are formed on the second surface 719 of the substrate 701 used to connect the substrate 701 with at least one external electronic device (not shown).

Figure 8:
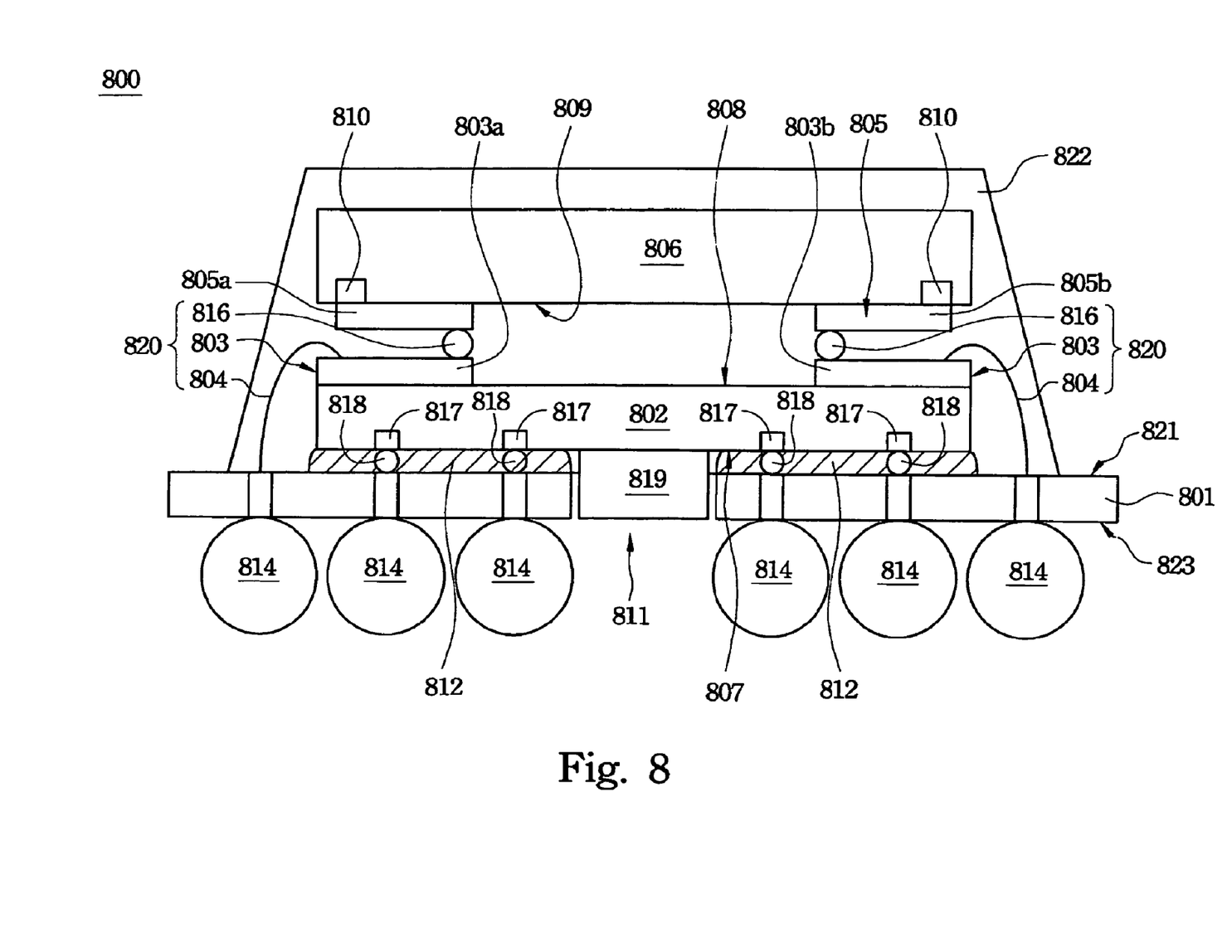
FIG. 8 illustrates a cross section view of a chip-stacked package structure 800 in accordance with a sixth preferred embodiment of the present invention.

FIG. 8 illustrates a cross section view of a chip-stacked package structure 800 in accordance with a sixth preferred embodiment of the present invention.

The chip-stacked package structure 800 comprises a substrate 801, a first chip 802, a second patterned circuit layer 805, a second chip 806, an electrical connecting means 820, a molding compound 822 and a plurality of external connecting bumps 814.

The substrate 801 has a first surface 821 and second surface 823 opposite to the first surface 821. In some preferred embodiments of the present invention, the substrate 801 can be a lead frame, a printed circuit board or a die carrier. The first chip 802 has a first active area 807 facing the substrate 801 and a first rear surface 808 opposite to the first active area 807, wherein the first chip 802 is set on the first surface 821 of the substrate 801 flip chip bonding process. In the present embodiment, the first active area 807 has a plurality of first bonding pads 817 set thereon, and a plurality of solder bumps 818 electrically connect the first bonding pads 817 to the substrate 801.

An underfill material 812 is used to encapsulate the bumps 818 and to fix the first chip 802 over the first surface 821 of the substrate 801.

In some preferred embodiment, a heat sink 819 can be extend out of the through hole 811 from the exposed portion of the first active area 807 to enhance the heat dispersion of the chip-stacked package structure 800.

The electrical connecting means 820 set on the first rear surface 808 of the first chip 802. In the present embodiment of the present invention, the electrical connecting means 820 comprises a first patterned circuit layer 803, at least one bonding wire (such as the bonding wire 804), and at least one conductive bump (such as the conductive 816).

The first patterned circuit layer 803 set on the first rear surface 808 is a redistribution layer comprising a plurality of fingers, such as a finger 603a or a finger 803b, wherein at least one finger, (for example the finger 803a) has one end extending towards the edge of the first rear surface 808 of the first chip 802, and the bonding wire 804 electrically connects at least one finger (for example the finger 803a) to the substrate 801; the other end of the finger 803a is electrically connected to the conductive bump 816.

The second chip 806 set on the first chip 802 has a second active area 809 facing the first chip 802, wherein the second active area 809 has at least one second bonding pad, such as bonding pads 810 set thereon. The second patterned circuit layer 805 set on the second active area 809 has a plurality of fingers, such as a finger 803a or a finger 803b, electrically connected with the second bonding pads 810, wherein at least one finger (for example the finger 805a) has an end electrically connected to one of the second bonding pads 810.

When a flip chip bonding process stacks the second chip 806 on the first chip 802, the second patterned circuit layer 805, the conductive bump 816, the first patterned circuit layer 803 and the bonding wire 804 can electrically connect at least one of the second bonding pads 810 to the substrate 801.

The molding compound 822 encapsulates the substrate 801, the first chip 802 and the second chip 806. A plurality of external connecting bumps 814, such as a plurality of solder bumps, are formed on the second surface 823 of the substrate 801 used to connect the substrate 801 with at least one external electronic device (not shown).

Figure 9:
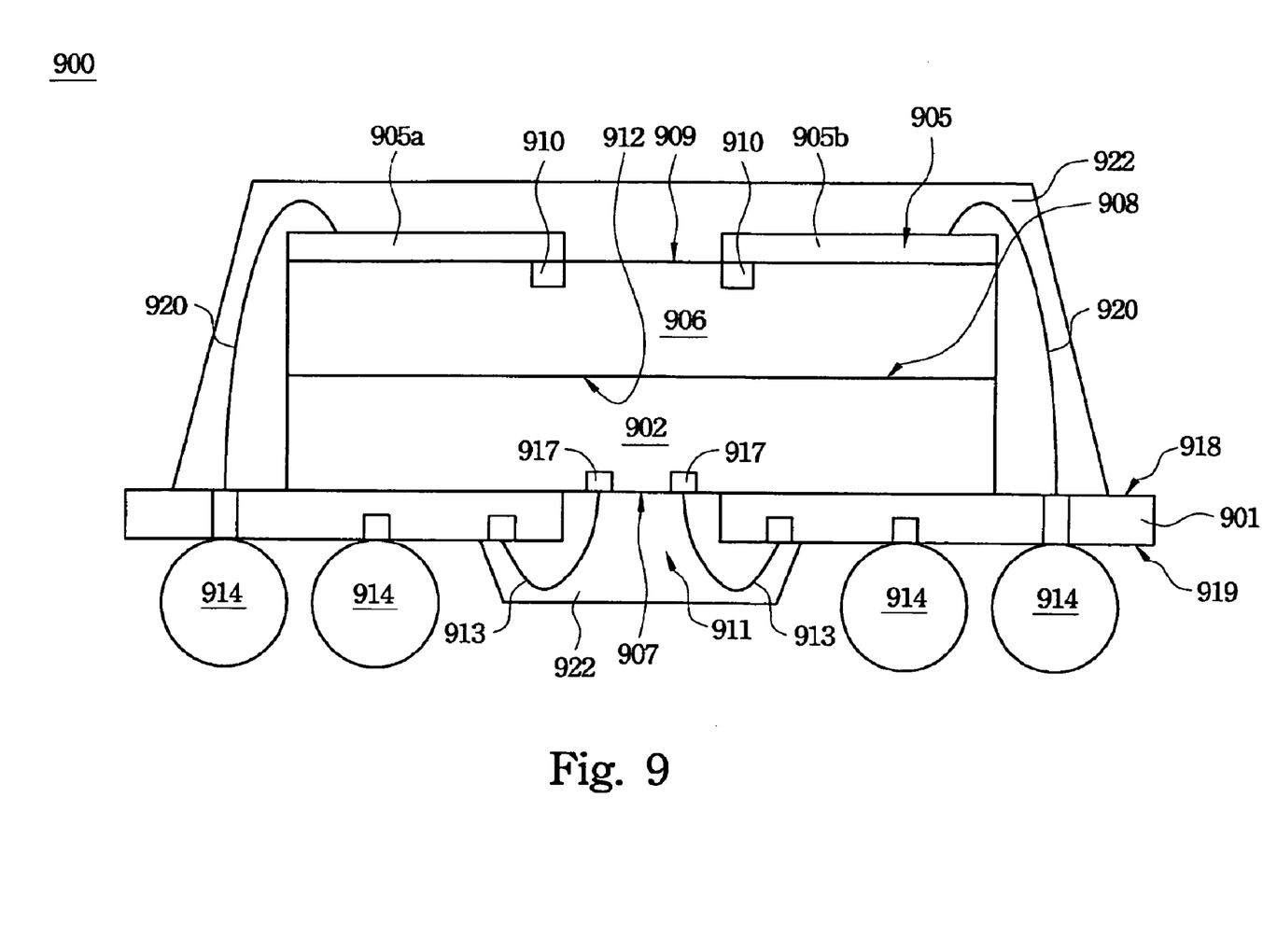
FIG. 9 illustrates a cross section view of a chip-stacked package structure 900 in accordance with a seventh preferred embodiment of the present invention.

FIG. 9 illustrates a cross section view of a chip-stacked package structure 900 in accordance with a seventh preferred embodiment of the present invention.

The chip-stacked package structure 900 comprises a substrate 901, a first chip 902, a patterned circuit layer 905, a second chip 906, an electrical connecting means 920, a molding compound 922 and a plurality of external connecting bumps 914.

The substrate 901 has a first surface 918 and second surface 919 opposite to the first surface 918. In some preferred embodiments of the present invention, the substrate 901 can be a lead frame, a printed circuit board or a die carrier. The first chip 902 has a first active area 907 facing the substrate 901 and a first rear surface 908 opposite to the first active area 907, wherein an adhering layer (not shown) sets the first chip 902 on the first surface 918 of the substrate 901. In the present embodiment, a portion of the first active area 907 is adhered on the first surface 918 of the substrate 901; and the other portion of the first active area 907 that has a plurality of first bonding pads 917 set thereon is exposed from the though hole 911. Wherein at least one of the first bonding pads 917 is electrically connected to the substrate 901 by a bonding wire 913 passing though the though hole 911.

The second chip 906 set on the first chip 902 has a second active area 909 and a second rear surface 912 opposite to the second active area 909. In the present embodiment, an adhering layer (not shown) adheres the second rear surface 912 facing the first chip 902 on the first rear surface 908. Wherein the second active area 909 has at least one second bonding pad, such as bonding pads 910 set thereon.

The patterned circuit layer 905 set on the second active area 909 has a plurality of fingers, such as a finger 905a or a finger 905b, electrically connected with the second bonding pads 910, wherein at least one finger (for example the finger 905a) has an end electrically connected to one of the second bonding pads 910.

In the present embodiment of the present invention, the electrical connecting means 920 comprises at least one bonding wire used to electrically connect the second patterned circuit layer 905 with the substrate 901.

The molding compound 922 encapsulates the substrate 901, the first chip 902 and the second chip 906. A plurality of external connecting bumps 914, such as a plurality of solder bumps, are formed on the second surface 919 of the substrate 901 used to connect the substrate 901 with at least one external electronic device (not shown).

When the second chip 906 is stacked on the first chip 902, the patterned circuit layer 905 and the molding compound 920 (at least one bonding wire) electrically connects at least one of the second bonding pads 910 to the substrate 901.

Figure 10:
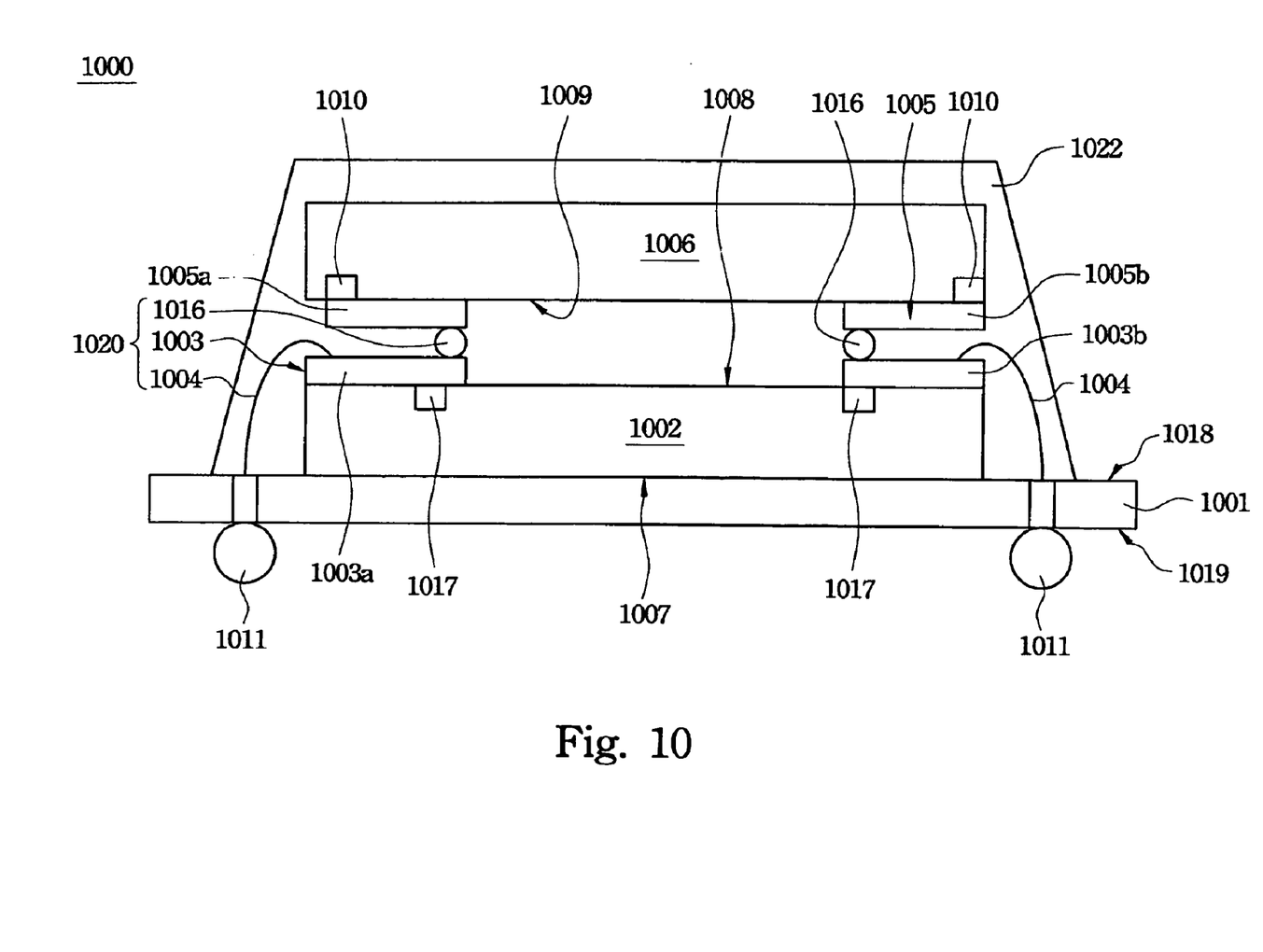
FIG. 10 illustrates a cross section view of a chip-stacked package structure 1000 in accordance with an eighth preferred embodiment of the present invention.

FIG. 10 illustrates a cross section view of a chip-stacked package structure 1000 in accordance with an eighth preferred embodiment of the present invention.

The chip-stacked package structure 1000 comprises a substrate 1001, a first chip 1002, a patterned circuit layer 1005, a second chip 1006, an electrical connecting means 1020, a molding compound 1022 and a plurality of external connecting bumps 1011.

The substrate 1001 has a first surface 1018 and second surface 1019 opposite to the first surface 1018. In some preferred embodiments of the present invention, the substrate 1001 can be a lead frame, a printed circuit board or a die carrier. The first chip 1002 has a first rear surface 1007 facing the substrate 1001 and a first active area 1008 opposite to the first rear surface 1007, wherein an adhering layer (not shown) sets the first chip 1002 on the first surface 1018 of the substrate 1001. In the present embodiment, the first active area 1008 has a plurality of first bonding pads 1017.

The electrical connecting means 1020 is set on the first active area 1008 of the first chip 1002. In the present embodiment of the present invention, the electrical connecting means 1020 comprises a first patterned circuit layer 1003, at least one bonding wire (such as the first bonding wires 1004), and at least one conductive bump (such as the conductive bumps 1016).

The first patterned circuit layer 1003 set on the first active area 1008 is a redistribution layer comprising a plurality of fingers, such as a finger 1003a and a finger 1003b, wherein at least one finger (the finger 1003a) has one end extending towards the edge of the first active area 1008 of the first chip 1002, and the first bonding wire 1004 electrically connects at least one finger (the finger 1003a) to the substrate 1001; the other end of the first finger 1003a is electrically connected to one of the conductive bumps 1016.

The second chip 1006 set on the first chip 1002 has a second active area 1009 facing the first chip 1002, wherein the second active area 1009 has at least one second bonding pad, such as a plurality of second bonding pads 1010 set thereon. The second patterned circuit layer 1005 set on the second active area 1009 has a plurality of fingers, such as a finger 1005a and a finger 1005b, electrically connected with the second bonding pad 1010. Wherein, at least one finger, such as the finger 1005a, has an end electrically connected to one of the second bonding pads 1010; the other end of the finger 1005a is electrically connected to one of the conductive bumps 1016. Therefore, when the second chip 1006 is stacked on the first chip 1002 by a flip-chip bonding process, at least one of the second bonding pad 1010 can be electrically connected to the substrate 1001 via the second patterned circuit layer 705, the conductive bump 1016, the first patterned circuit layer 1003 and the bonding wire 1004. In the present embodiment, since the first bonding pads 1017 of the first chip 1002 and the second bonding pads 1010 of the second chip 1006 are both electrically connected to the first patterned circuit layer 1003, the first bonding pads 1017 and the second bonding pad may transmit identical signals in operation.

The molding compound 1020 encapsulates the substrate 701, the second chip 1006 and the first chip 1002. A plurality of external connecting bumps 1011, such as a plurality of solder bumps, are formed on the second surface 1019 of the substrate 1001 used to connect the substrate 1001 with at least one external electronic device (not shown).

Figure 11:
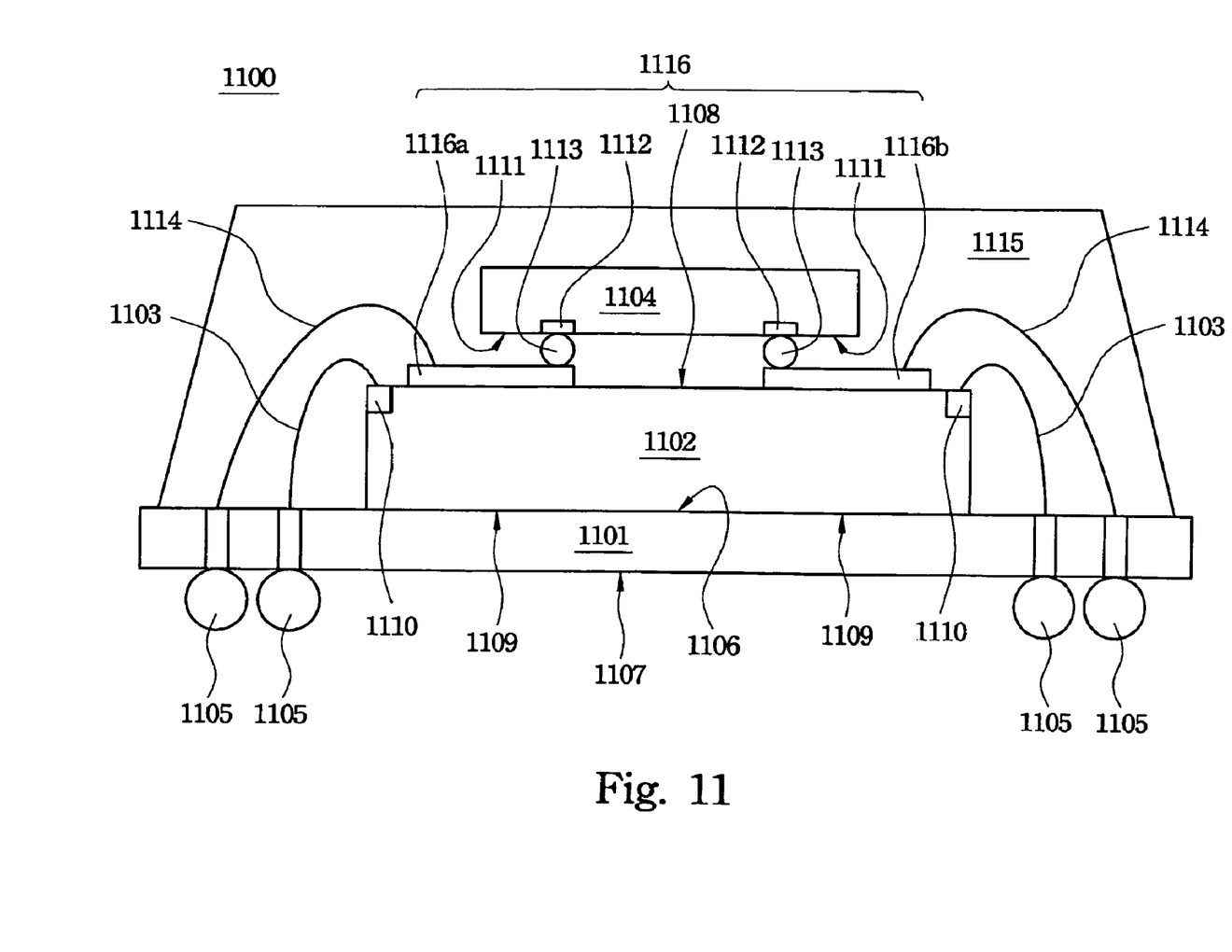
FIG. 11 illustrates a cross section view of a chip-stacked package structure 1100 in accordance with a ninth preferred embodiment of the present invention.

FIG. 11 illustrates a cross section view of a chip-stacked package structure 1100 in accordance with a ninth preferred embodiment of the present invention.

The chip-stacked package structure 1100 comprises a substrate 1101, a first chip 1002, a patterned circuit layer 1116, a second chip 1104, at least one first bonding wire 1103, a molding compound 1115 and a plurality of external connecting bumps 1105.

The substrate 1101 has a first surface 1106 and second surface 1107 opposite to the first surface 1106.

The first chip 1102 has a first rear surface 1009 facing the substrate 1101 and a first active area 1108 opposite to the first rear surface 1109, wherein the adhesive layer (not shown) sets the first chip 1102 on the first surface 1106 of the substrate 1101. In the present embodiment, the first active area 1108 has a plurality of first bonding pads 1110, and one of the first bonding wires 1103 electrically connects each of the first bonding pads 1110 to the substrate 1101.

The second chip 1104 set on the first chip 1102 has a second active area 1111 facing the first chip 1102, wherein the second active area 1111 with at least one second bonding pad, such as the bonding pad 1112 set thereon has a size smaller than that of the first chip 1102.

The patterned circuit layer 1116 is set on the first active area 1108 of the first chip 1102 separated from the first bonding pads 1110 by a certain distance. Thus the patterned circuit layer 1116 does not have electrical contact with the first bonding pads 1110 directly. In the present embodiment, the patterned circuit layer 1116 comprises a plurality of fingers, such as a finger 1116a and a finger 1116b, electrically connected with the second bonding pad 1112. Wherein a conductive bump 1113 electrically connects at least one finger, such as the finger 1116a, to one of the second bonding pads 1110; the other end of the finger 1116a extends towards the edge of the first rear surface 1108 of the first chip 1102, and a second bonding wire 1114 electrically connects the other end of the finger 1116a to the substrate 1101.

The molding compound 1115 encapsulates the substrate 1101, the second chip 1104 and the first chip 1102. A plurality of external connecting bumps 1105, such as a plurality of solder bumps, are formed on the second surface 1107 of the substrate 1101 used to connect the substrate 1101 with at least one external electronic device (not shown).

In present embodiment of the invention, the wiring arrangement of the patterned circuit layer 1116 can be altered in accordance with the different wiring design of various chips to shift the bonding area of the second bonding pads 1112 to the location in adjacent to the edge of the first chip 1102. Therefore, it is not necessary to extend the length and the radian of the bonding wires that are electrically connect the second bonding pads 1112 with the substrate 1101, or to utilize a dummy chip that involves more chips in a single package.

In accordance with above descriptions, the features of the present invention provide at least one patterned circuit layer set either on a lower chip or on an upper chip in a chip-stacked package structure, wherein the patterned circuit layer has at least one finger electrically connected with at least one bonding pad set on the upper chip, whereby the wiring arrangements of the upper chip constituted by the bonding pad can be redistributed by the fingers of the patterned circuit layer so as to shift the bonding area of the bonding pad towards the edge of the upper chip for a bonding wire to electrically connect the bonding pad with the substrate. Accordingly, it is not necessary to extend the length and the radian of the bonding wire in connecting the upper chips with the substrate or to reduce the size of the upper chip for involving more chips in a single package, so as to solve the prior problems in the art.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A chip-stacked package structure, comprising:
    a substrate with a first surface and a second surface opposite to the first surface;
    a first chip set on the first surface of the substrate, wherein the first chip comprises:
        a first active area and a first rear surface opposite to the first active area, wherein the first active area faces the substrate and is electrically connected to the substrate; and
        a first patterned circuit layer formed on and directly contacted with the first rear surface and electrically connected to the substrate via at least one bonding wire;
    a second chip set on the first patterned circuit layer, where the second chip has:
        a second active area that faces the first rear area; and
        at least one second bonding pad set on the second active area, wherein the second bonding pad is electrically connected to the first patterned circuit layer and is electrically connected to the substrate via the bonding wire; and
    a molding compound fills a space between the first chip, the substrate, the first patterned circuit layer and the second chip.

2. The chip-stacked package structure in accordance with claim 1, further comprising a plurality of external connecting bumps set on the second surface of the substrate.

3. The chip-stacked package structure in accordance with claim 1, wherein a plurality of bumps electrically connects a plurality of first bonding pads on the first active area to the substrate.

4. The chip-stacked package structure in accordance with claim 1, wherein the substrate has a through hole used to expose a portion of the first active area.

5. The chip-stacked package structure in accordance with claim 4, wherein a plurality of bumps electrically connects a plurality of first bonding pads on the first active area to the substrate.

6. The chip-stacked package structure in accordance with claim 3, further comprising underfill materials used to encapsulate the bumps and to fix the first chip over the first surface of the substrate.

7. The chip-stacked package structure in accordance with claim 6, further comprising a heat sink extending out of the through hole from the exposed portion of the first active area.

8. The chip-stacked package structure in accordance with claim 4, wherein the first active area has a plurality of first bonding pads set thereon and electrically connected to the substrate via a plurality of bonding wires passing through the through hole.

9. The chip-stacked package structure in accordance with claim 4, further comprising a heat sink extending out of the through hole from the exposed portion of the first active area.

10. The chip-stacked package structure in accordance with claim 1, wherein the first patterned circuit layer is a redistribution layer.

11. The chip-stacked package structure in accordance with claim 1, wherein the second bonding pad is electrically connected to the first patterned circuit layer by at least one bump or solder.

12. The chip-stacked package structure in accordance with claim 1, wherein the second chip further comprises:
    a second patterned circuit layer set on the second active area and connected with the second bonding pad, wherein the second patterned circuit layer is electrically connected with the first patterned circuit layer by at least one bump or solder.

13. The chip-stacked package structure in accordance with claim 12, wherein the second patterned circuit layer is a redistribution layer.

* * * * *